United States Patent [19]
Kikuda et al.

[11] Patent Number: 4,994,689
[45] Date of Patent: Feb. 19, 1991

[54] SEMICONDUCTOR INTEGRATED CIRCUIT DEVICE

[75] Inventors: Shigeru Kikuda; Hiroshi Miyamoto, both of Hyogo, Japan

[73] Assignee: Mitsubishi Denki Kabushiki Kaisha, Tokyo, Japan

[21] Appl. No.: 435,860

[22] Filed: Nov. 14, 1989

[30] Foreign Application Priority Data

Dec. 5, 1988 [JP] Japan .................................. 63-308101

[51] Int. Cl.$^5$ ........................ H03K 3/01; H03K 3/353
[52] U.S. Cl. ............................ 307/296.2; 307/296.5; 307/304
[58] Field of Search ............... 307/296.2, 296.4, 296.5, 307/303, 304, 272.3; 365/189.09, 189.06, 226

[56] References Cited

U.S. PATENT DOCUMENTS

| | | | |
|---|---|---|---|
| 4,631,421 | 12/1986 | Inoue et al. | 307/594 |
| 4,794,278 | 12/1988 | Vajdic | 307/351 |
| 4,849,654 | 7/1989 | Okada | 307/296.4 |
| 4,890,011 | 12/1989 | Miyatake | 307/296.2 |
| 4,904,885 | 2/1990 | Yamada et al. | 307/296.2 |

FOREIGN PATENT DOCUMENTS

| | | |
|---|---|---|
| 0142258 | 10/1984 | European Pat. Off. |
| 61-222318 | 10/1986 | Japan |
| 62-121996 | 6/1987 | Japan |
| 63-10397 | 1/1988 | Japan |
| 63-122087 | 5/1988 | Japan |

OTHER PUBLICATIONS

S. Fields, "New Way Proposed to End Latch Up" *Electronics* (Feb. 23, 1984), pp. 54–56.

*Primary Examiner*—Stanley D. Miller
*Assistant Examiner*—Richard Roseen
*Attorney, Agent, or Firm*—Lowe, Price, LeBlanc, Becker & Shur

[57] ABSTRACT

A potential of a semiconductor substrate is clamped to a ground potential by a $V_{BB}$ clamping circuit until a first time period has elapsed since turning on of a power supply. Furthermore, the operation of a main circuit is prohibited until a second time period has elapsed which is longer than the first time period, so that a rise in a substrate voltage is suppressed until the driving capability of a $V_{BB}$ generating circuit is fully achieved.

4 Claims, 10 Drawing Sheets

SEMICONDUCTOR INTEGRATED CIRCUIT DEVICE

BACKGROUND OF THE INVENTION

1. Field of the Invention

The present invention relates to a semiconductor integrated circuit device and particularly to a semiconductor integrated circuit device including a substrate bias generating circuit.

2. Description of the Background Art

An example of a semiconductor integrated circuit device including a substrate bias generating circuit is a semiconductor memory of a CMOS structure.

The above described semiconductor integrated circuit device having a CMOS structure comprises a memory section and a peripheral circuit section. The memory section comprises a circuit formed on a P-type substrate and each node thereof has a PN junction. When the potential of the N layers of the PN junction is lowered due to undershoot of a signal inputted to the above described circuit, a forward bias voltage is applied to the above described PN junction, and a current which is not inherently to flow in the PN junction section actually flows, so that memory cell information, for example, is liable to be destroyed.

To prevent malfunctions of such an internal circuit, it has been proposed that the P-type substrate is provided with a negative potential to keep the PN junction section always in the reverse bias state. A substrate bias generating circuit is a circuit which is provided for supplying the negative potential therefor.

Figure 1:
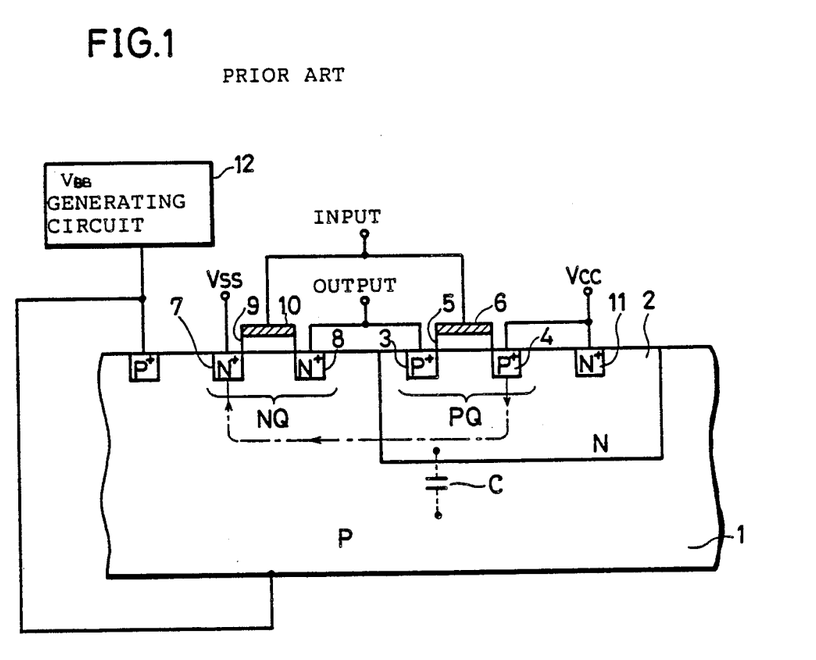
FIG. 1 illustrates a cross sectional view of a conventional semiconductor integrated circuit device of a CMOS structure including a $V_{BB}$ generating circuit.
Figure 2:
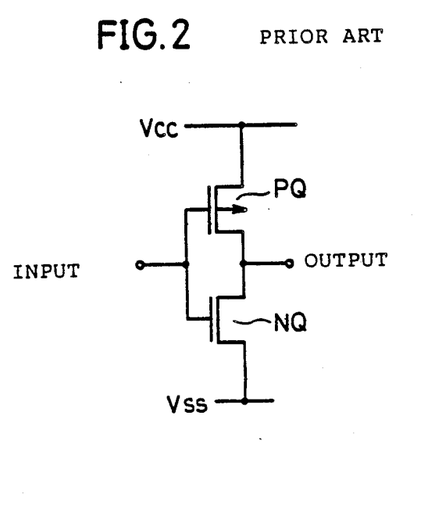
FIG. 2 illustrates an equivalent circuit diagram of a CMOS inverter formed in the semiconductor integrated circuit device shown in FIG. 1.

FIG. 1 illustrates a cross sectional structure of a conventional semiconductor integrated circuit device of a CMOS structure, including the above mentioned substrate bias generating circuit. In the semiconductor integrated circuit device shown in FIG. 1, a CMOS inverter is formed as shown by an equivalent circuit of FIG. 2. In FIG. 1, an N-type well 2 is formed in a P-type semiconductor substrate 1, and a P-channel MOS transistor PQ is formed within the N-type well 2. The P-channel MOS transistor PQ comprises P+ diffusion layers 3 and 4, a gate insulation film which is a region between these P+ diffusion layers 3 and 4 and formed on the surface of the N-type well 2, and a gate electrode 6 formed on this gate insulation film 5. Meanwhile, an N-channel MOS transistor NQ is formed in the other part of the P-type semiconductor substrate 1 where the N-type well 2 is not formed. The N- channel MOS transistor NQ comprises N+ diffusion layers 7 and 8 which are source and drain, respectively, a gate insulation film 9 which is a region between these N+ diffusion layers 7 and 8 and formed on the surface of the P-type semiconductor substrate 1, and a gate electrode 10 formed on the gate insulation film 9. The gate electrodes 6 and 10 are connected to an input terminal, while the P+ diffusion layer 3 and N+ diffusion layer 8 are connected to an output terminal Further, a supply voltage $V_{CC}$ is applied to the P+ diffusion layer 4 while a ground voltage $V_{ss}$ is applied to the N+ diffusion layer 7. The supply voltage $V_{CC}$ is also applied to the N-type well 2 through an N+ diffusion layer 11.

In the above described structure, a substrate bias generating circuit (hereinafter referred to as a $V_{BB}$ generating circuit) 12 is formed on the semiconductor substrate 1. The $V_{BB}$ generating circuit 12 generates a negative voltage when the supply voltage $V_{CC}$ is applied. This negative voltage is supplied to the semiconductor substrate 1. Accordingly, after a power supply is turned on, a region between the P-type semiconductor substrate 1 and the N layer contacting therewith is rendered reverse bias, so that the previously mentioned inconvenience is eliminated.

Figure 3:
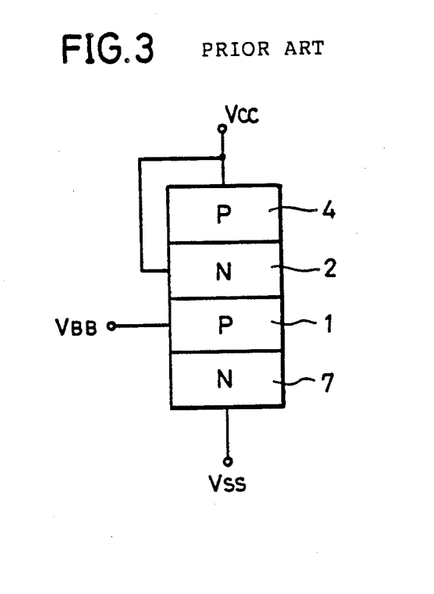
FIG. 3 illustrates a diagram of thyristor circuit parasitic between a supply voltage $V_{CC}$ and a ground voltage $V_{SS}$ in the semiconductor integrated circuit device shown in FIG. 1.

Meanwhile, upon feeding the supply voltage $V_{CC}$, the potential of the P-type semiconductor substrate 1 is raised by a junction capacitance C between the P-type semiconductor substrate 1 and the N-type well 2. Furthermore, when the operation of the circuit in the semiconductor substrate is started by turning on of the power supply, an electric current flows in the semiconductor substrate to cause fluctuation of a substrate voltage. As a result, the substrate voltage is increased. However, when the supply voltage $V_{CC}$ is low, the $V_{BB}$ generating circuit 12 has relatively a low current driving capability, so that a rise in the potential of the semiconductor substrate 1 cannot be suppressed promptly. A thyristor circuit, in which P layers and N layers are alternately superimposed in four layers as shown in FIG. 3, is parasitic between the supply voltage $V_{CC}$ and the ground voltage $V_{SS}$. If the potential of the semiconductor substrate 1 rises upon turning on of the power supply, a region between the semiconductor substrate 1 and the N+ diffusion layer 7 is rendered forward bias and the thyristor circuit shown in FIG. 3 is turned on. As a result, a current constantly flows through a path shown with a chain dotted line in FIG. 1. This phenomenon is called latch up, causing malfunctions of the circuit and destruction of the elements.

Figure 4:
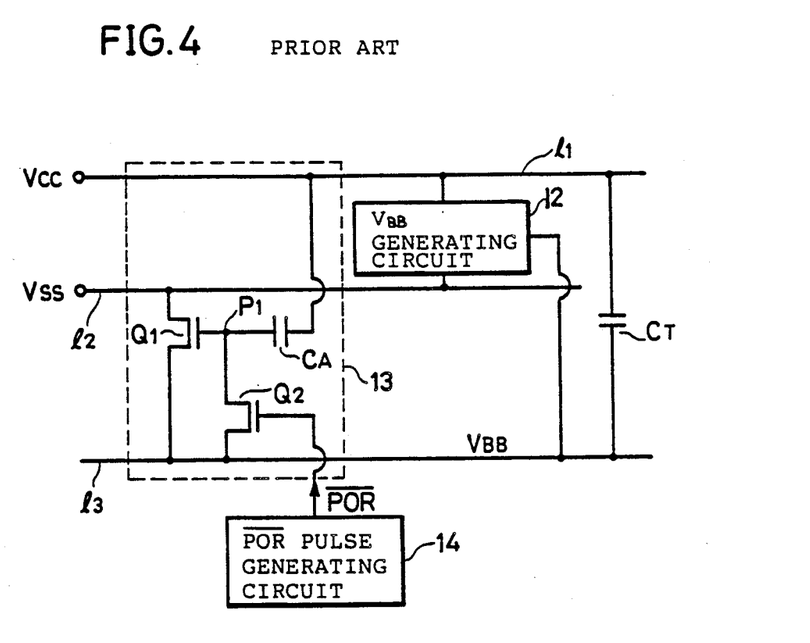
Figure 7:
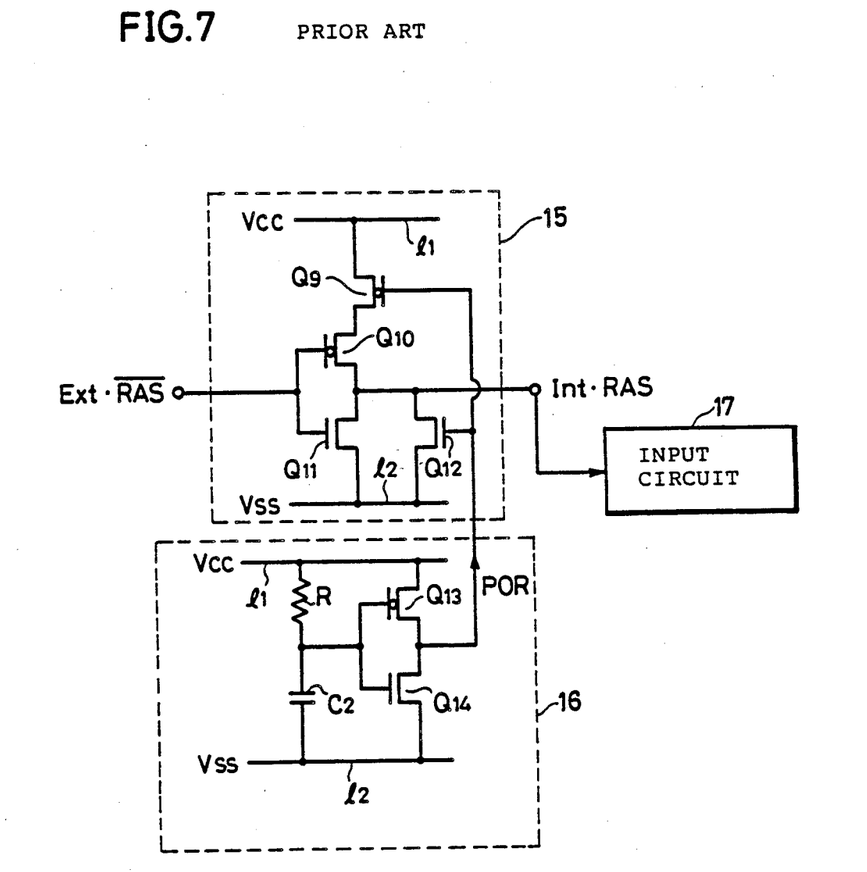

Circuits shown in FIGS. 4 and 7 have been proposed in order to prevent the latch up on turning on of the power supply as described above.

A conventional example shown in FIG. 4 comprises a $V_{BB}$ clamping circuit 13 in addition to the $V_{BB}$ generating circuit 12. This $V_{BB}$ clamping circuit 13 operates responsive to an output signal $\overline{POR}$ of a $\overline{POR}$ pulse generating circuit 14 and serves to clamp the substrate potential down to the ground potential until the driving capability of the $V_{BB}$ generating circuit 12 to reduce the substrate voltage is sufficiently high after the supply voltage is applied. The $V_{BB}$ clamping circuit 13 comprises two N-channel MOS transistors $Q_1$ and $Q_2$ and a capacitor $C_A$. The transistor $Q_1$ has its drain connected to a $V_{SS}$ line 12, its source connected to a $V_{BB}$ line 13 and its gate connected to a $V_{CC}$ line 11 via the capacitor $C_A$. The supply voltage $V_{CC}$ and the the ground voltage $V_{SS}$ are applied to the $V_{CC}$ line 11 and $V_{SS}$ line 12, respectively, and a negative substrate bias voltage $V_{BB}$ from the $V_{BB}$ generating circuit 12 is applied to the $V_{BB}$ line 13. The transistor $Q_2$ has its drain connected to the gate of the transistor $Q_1$ via a node $P_1$ and its source connected to the $V_{BB}$ line 13. Moreover, the gate of the transistor $Q_2$ is provided with the output signal $\overline{POR}$ of the $\overline{POR}$ pulse generating circuit 14. Parasitic capacitance $C_T$ lies between the Vcc line 11 and the $V_{BB}$ line 13.

Figure 5:
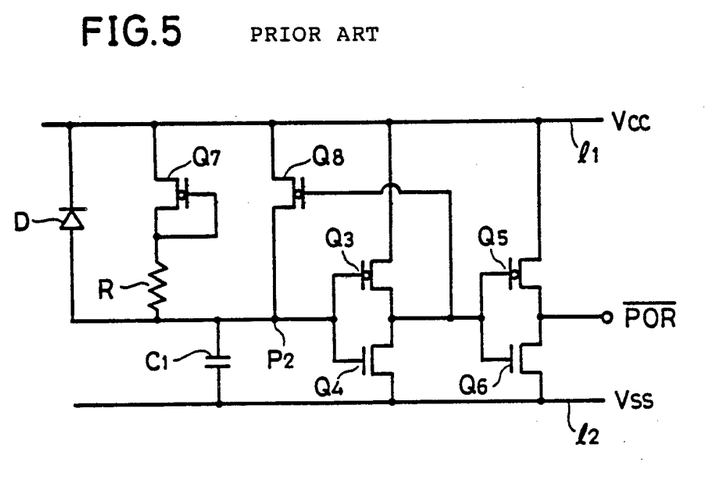
FIG. 5 is a circuit diagram illustrating the configuration of a $\overline{POR}$ pulse generating circuit 14 shown in FIG. 4.

FIG. 5 illustrates an example of the circuit configuration of the $\overline{POR}$ pulse generating circuit 14 shown in FIG. 4. This circuit configuration shown in FIG. 5 is disclosed in Japanese Patent Laying Open No. 61-222318. As illustrated in the figure, the $\overline{POR}$ pulse generating circuit of FIG. 5 is formed of P-channel MOS transistors $Q_3$, $Q_5$, $Q_7$, $Q_8$, N-channel MOS transistors $Q_4$, $Q_6$, a resistor R, a capacitor $C_1$ and a diode D. In this $\overline{POR}$ pulse generating circuit, the output $\overline{POR}$ is at a low level in a given time period after the supply voltage is applied; however, when a charge is stored in the capacitor $C_1$ in a given time period and the potential of node $P_2$ exceeds a threshold of an inverter comprising the transistors $Q_3$ and $Q_4$, the output $\overline{POR}$ goes to a high level and is kept at the high level thereafter.

Figure 6A:
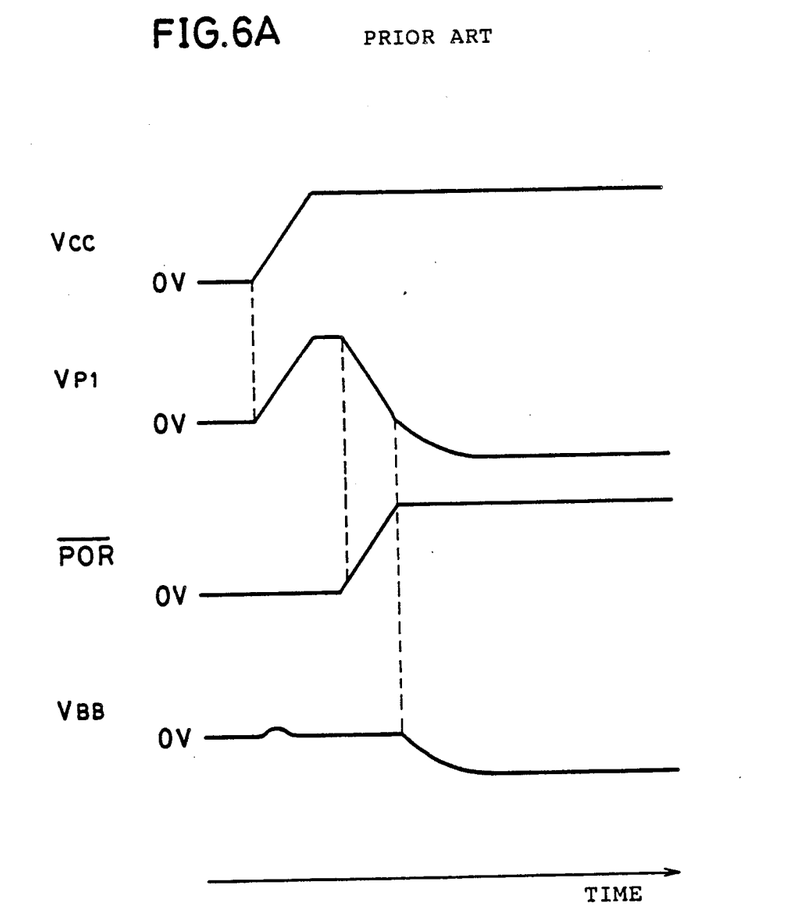
FIG. 6A is a timing chart for illustrating the operation of the conventional circuit shown in FIG. 4.

The operation of a conventional circuit in FIG. 4 will now be described in reference with a timing chart illustrated in FIG. 6A. FIG. 6A illustrates changes of the supply voltage $V_{CC}$ dependent on the time elapsed, the potential $V_{P1}$ of the node $P_1$, the $\overline{POR}$ signal and the substrate voltage $V_{BB}$ immediately after the supply voltage $V_{CC}$ is applied. As the supply voltage $V_{CC}$ rises, the potential $V_{P1}$ of the node $P_1$ also rises due to capacitive coupling of the capacitor $C_4$. Further, the substrate voltage $V_{BB}$ also rises due to capacitive coupling of the parasitic capacitor $C_T$; however, when the potential $V_{P1}$ of the node $P_1$ exceeds the threshold of the transistor $Q_1$, the transistor comes to be conductive, and the line $V_{SS}$ line 12 and $V_{BB}$ line 13 are short-circuited, so that the substrate voltage $V_{BB}$ is forced to be clamped to 0 V. Subsequently, as a given time elapses after the supply voltage is applied, the signal $\overline{POR}$ goes to a high level and the transistor $Q_2$ comes to be conductive, so that the potential of the node $P_1$ is discharged to 0 V. As a result, the transistor $Q_1$ comes to be conductive. Subsequently, the substrate voltage $V_{BB}$ proceeds in a negative direction to be stable through the operation of the $V_{BB}$ generating circuit 12. As described heretofore, the substrate voltage is forced to be clamped to 0 V so as to prevent latch up within a given time period after the supply voltage is applied, in a conventional example in which the $V_{BB}$ clamping circuit 13 is in use.

FIG. 7 illustrates an input circuit of an external row address strobe signal (hereinafter referred to as an Ext·$\overline{RAS}$ signal) of DRAM (dynamic random access memory) disclosed, for example, in Japanese Patent Laying Open No. 63-10397. The conventional example of FIG. 7 is formed of an input prohibiting circuit 15 and a POR pulse generating circuit 16. The input prohibiting circuit 15 is formed of a P-channel MOS transistor $Q_{10}$ and an N-channel MOS transistor $Q_{11}$, comprising a CMOS inverter for producing an internal row address strobe signal (hereinafter referred to as an Int·RAS signal) inverted from the Ext·$\overline{RAS}$ signal, and a P-channel MOS transistor $Q_9$ and an N-channel MOS transistor $Q_{12}$ for prohibiting the output operation of this CMOS inverter. The POR pulse generating circuit 16 comprises a resistor R, a capacitor $C_2$, a P-channel MOS transistor $Q_{13}$ and an N-channel MOS transistor $Q_{14}$, outputting a signal POR for defining an input prohibiting operational timing of the input prohibiting circuit 15. The POR pulse generating circuit 16 performs the same operation as the one in which the transistors $Q_5$ and $Q_6$ are removed from the POR pulse generating circuit shown in FIG. 5. That is, after the supply voltage is applied, the POR pulse generating circuit 16 generates such a pulse signal POR as to be at a high level equal to the supply voltage $V_{CC}$ within a given time period, but fall down to a low level after the given time period. The Int·RAS signal produced in the input prohibiting circuit 15 is supplied to a main circuit of the semiconductor integrated circuit device via an input circuit 17. The input circuit 17 comprises, for example, a latch and a timing generator.

Figure 8A:
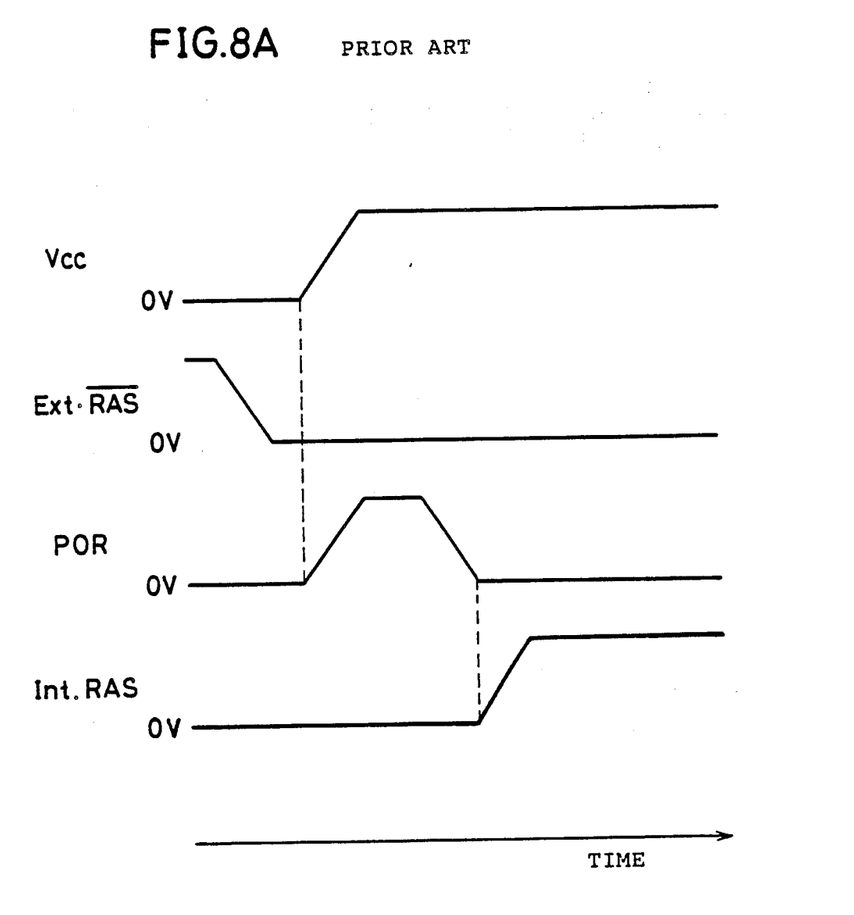
FIG. 8A is a timing chart for illustrating the operation of the conventional circuit shown in FIG. 7.

Now, the operation of the input circuit of the Ext·$\overline{RAS}$ signal in DRAM shown in FIG. 7 will be described in reference to a timing chart illustrated in FIG. 8A. FIG. 8A illustrates changes of the supply voltage $V_{CC}$ depending on the time elapsed, the Ext·$\overline{RAS}$ signal, the Int·RAS signal and the POR signal when the supply voltage $V_{CC}$ is applied. Even if the Ext·$\overline{RAS}$ signal is already at a low level before the supply voltage is applied, the transistor $Q_9$ is rendered non-conductive and the transistor $Q_{12}$ conductive because the POR signal goes to a high level as the supply voltage rises, so that the input prohibiting circuit 15 makes the Int·RAS signal be at a low level (non-active state) despite the state of the Ext·$\overline{RAS}$ signal Accordingly, activation of the Int·RAS signal is prohibited so that the main circuit is inoperative. When the POR signal goes down to a low level after a given time has elapsed thereafter, the transistor $Q_9$ is rendered conductive while the transistor $Q_{12}$ non-conductive, so that the Int·RAS signal inverted from the Ext·$\overline{RAS}$ signal is transmitted to the input circuit 17 so as to start the operation of the main circuit. As described above, the operation of the main circuit in a given time is prohibited after the supplied voltage is applied in the conventional example shown in FIG. 7. Therefore, the substrate voltage $V_{BB}$ does not rise in a given time, resulting from the start of operation of a sense amplifier included in the main circuit, so that latch up is prevented when a power supply is turned on.

As mentioned above, the conventional semiconductor integrated circuit device has a problem of causing latch up when the supply voltage rises sharply as described hereinafter, although preventing the latch up when the power supply is turned on.

Figure 6B:
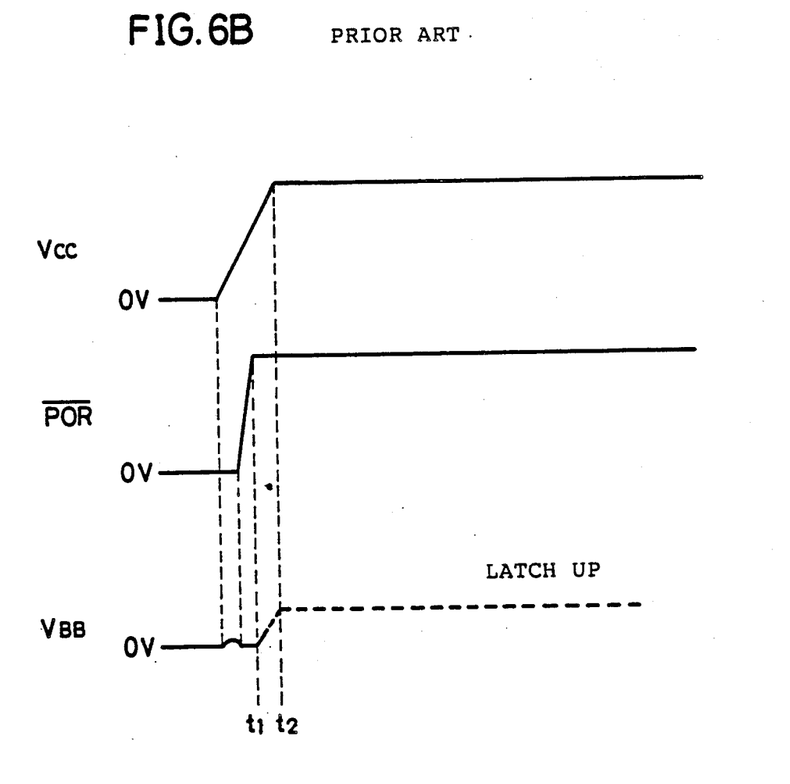
FIG. 6B is a timing chart for illustrating the operation of the conventional example of FIG. 4 when the supply voltage rises sharply.

First of all, in the conventional example shown in FIG. 4, when the supply voltage $V_{CC}$ rises sharply as shown in FIG. 6B, the signal $\overline{POR}$ rises rapidly, so that clamping operation by the $V_{BB}$ clamping circuit 13 is ended before the rising of the supply voltage $V_{CC}$ is completed (at time t1). However, since the supply voltage $V_{CC}$ is still low at this time t1, the driving capability of the $V_{BB}$ generating circuit 12 is also low. Consequently, a rise in the substrate voltage $V_{BB}$ after the time t1 when the clamping operation is completed. At this time, if the main circuit starts operating responsive to an external signal, electric currents flow in the semiconductor substrate so as to cause fluctuation of the substrate voltage $V_{BB}$. The prompt fluctuation of the substrate voltage $V_{BB}$ in a positive direction causes latch up.

Figure 8B:
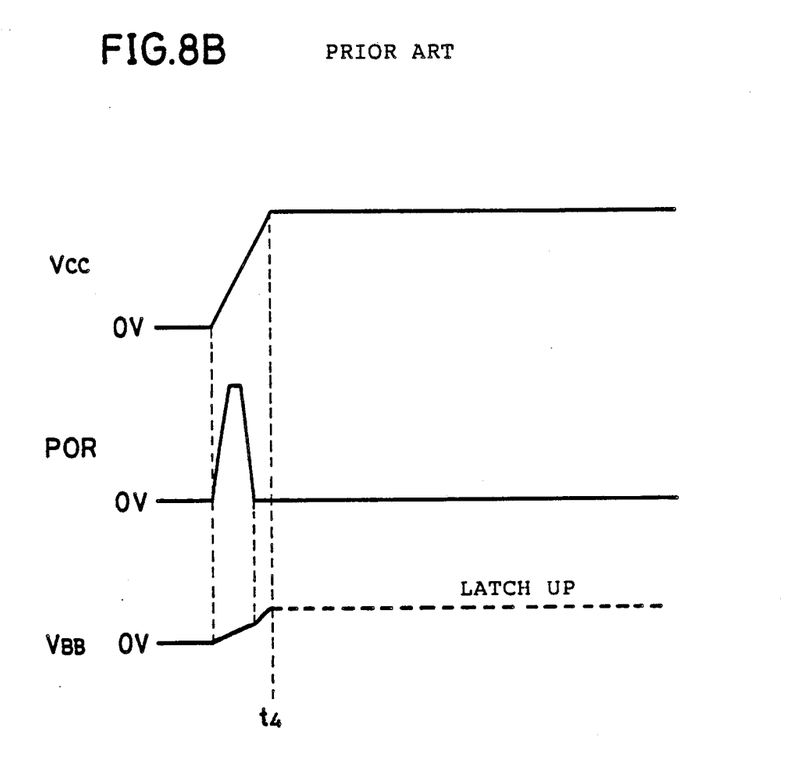
FIG. 8B is a timing chart for illustrating the operation of the conventional circuit of FIG. 7 when the supply voltage $V_{CC}$ rises sharply.

In addition, in the conventional example shown in FIG. 7, if the supply voltage $V_{CC}$ rises sharply as shown in FIG. 8, a falling timing of the signal POR is early, so that the main circuit starts operating before the supply voltage $V_{CC}$ sufficiently rises (at time t3). At this time, since the driving capability of the $V_{BB}$ generating circuit is still low, the substrate voltage happens to fluctuate greatly after the time t3 due to the operation of the main circuit so as to cause the latch up.

SUMMARY OF THE INVENTION

The present invention was made to eliminate the above mentioned problems and aims to provide a semiconductor integrated circuit device which can totally prevent the occurrence of a latch up even if supply voltage rises sharply.

To summarize the present invention, a potential of a semiconductor substrate is fixed to a ground potential by clamping means until a first time period has elapsed since turning on of a power supply, and further the operation of an input circuit is prohibited by prohibiting means so that a main circuit is inoperative until a second time period which is longer than the first time period has elapsed since turning on of the power supply.

According to the present invention in which clamping means and prohibiting means are provided, since the prohibiting operation of prohibiting means is released after the clamping operation of clamping means is released, even if the supply voltage rises sharply upon turning on of the power supply, a substrate voltage does not rise appreciably, so that the latch up can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 illustrates a schematic diagram of an example of a conventional circuit for preventing latch up when a power supply is turned on.

FIG. 7 illustrates a schematic diagram of another example of a conventional circuit for preventing latch up when the power supply is turned on.

DESCRIPTION OF THE PREFERRED EMBODIMENTS

Figure 9:
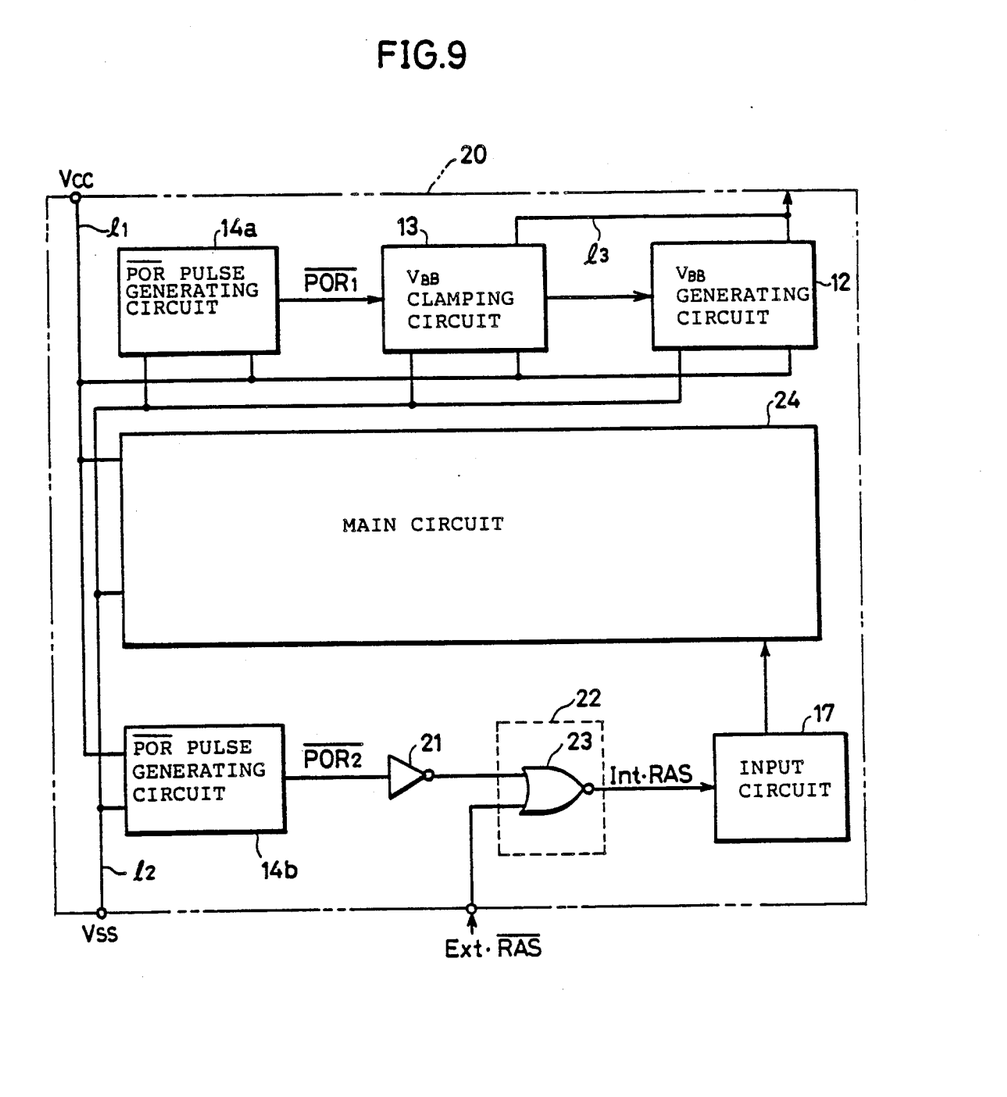
FIG. 9 is a schematic block diagram illustrating the configuration of one embodiment of the present invention.

FIG. 9 is a schematic block diagram illustrating the configuration of one embodiment of the present invention. The embodiment shown in this figure comprises a $\overline{POR}$ pulse generating circuit 14a, a $V_{BB}$ clamping circuit 13, a $V_{BB}$ generating circuit 12, a $\overline{POR}$ pulse generating circuit 14b, an inverter 21, an input prohibiting circit 22, an input circuit 17 and a main circuit 24, which are formed on a semiconductor substrate 20. The $\overline{POR}$ pulse generating circuits 14a and 14b are of the same circuit configurations as a $\overline{POR}$ pulse generating circuit shown in FIG. 5; however, each parameter of the circuits 14a and 14b (e.g. a capacitance value of a capacitor) is changed so that an output $\overline{POR1}$ of the $\overline{POR}$ pulse generating circuit 14a goes to a high level earlier than an output $\overline{POR2}$ of the $\overline{POR}$ pulse generating circuit 14b does. Since the $V_{BB}$ clamping circuit 13 and $V_{BB}$ generating circuit 12 are the same as the circuits shown in FIG. 4 while the input circuit 17 is identical to that shown in FIG. 7, the description of these circuits is left out. The input prohibiting circuit 22 comprises an NOR gate 23. This NOR gate 23 has its one input supplied with the one inverted by the inverter 21 from the output $\overline{POR2}$ of the $\overline{POR}$ pulse generating circuit 14b and the other input externally supplied with an Ext·RAS signal. The main circuit 24 comprises various circuits according to the functions of semiconductor integrated circuit device. For example, when the semiconductor integrated circuit device is a semiconductor storage device, the main circuit 24 comprises a memory cell array, a decoder etc. The other semiconductor integrated circuit devices comprise other logic circuits. That is, the present invention is widely applicable to semiconductor integrated circuit devices in general and is not limited to the semiconductor storage devices.

Figure 10:
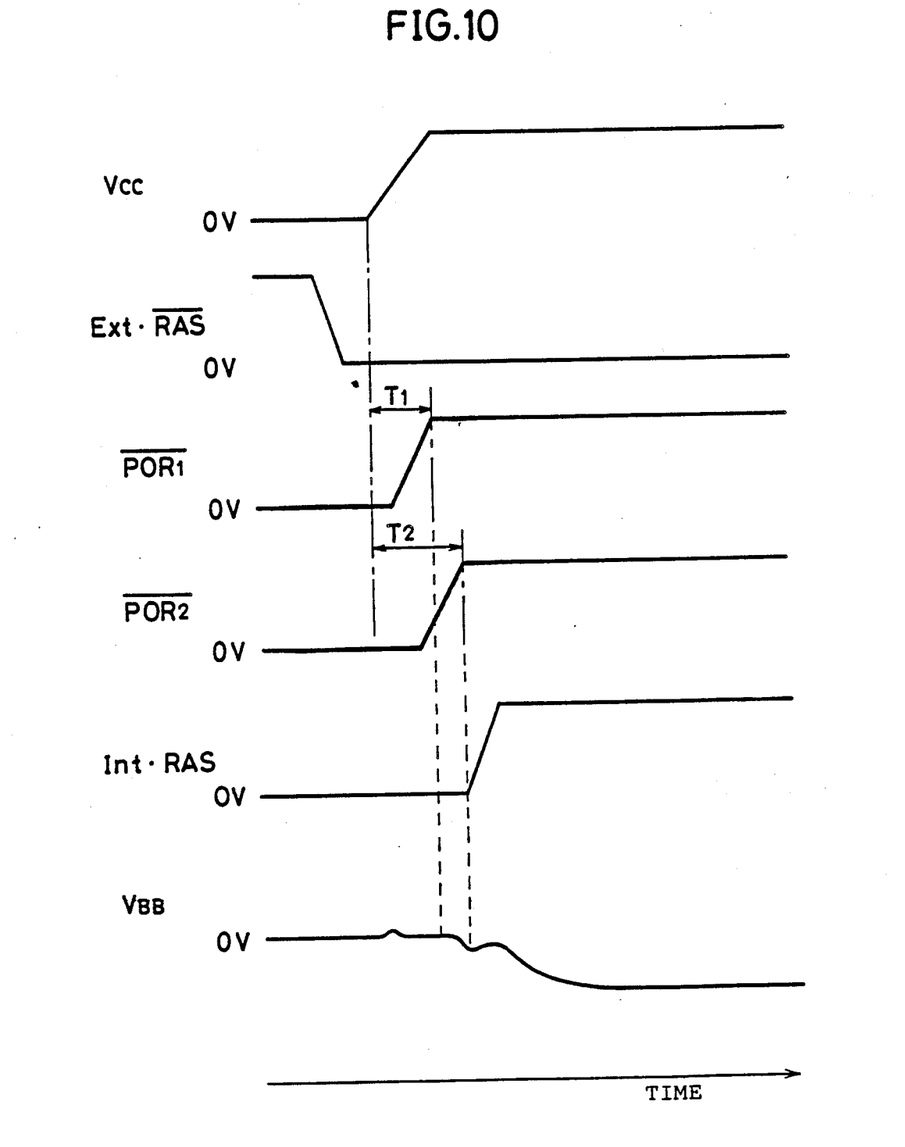
FIG. 10 is a timing chart for illustrating the operation of the embodiment shown in FIG. 9.

Now, an operation in the embodiment shown in FIG. 9 will be described in reference to the timing chart shown in FIG. 10. First of all, when a supply voltage $V_{CC}$ is applied, a substrate voltage is clamped to a ground potential by the $V_{BB}$ clamping circuit 13, so that the substrate voltage $V_{BB}$ does not rise according to capacitive coupling upon the rising of the supply voltage $V_{CC}$ and therefore, the substrate voltage $V_{BB}$ is forced to be 0 V. After turning on the power supply, a signal $\overline{POR1}$ goes to a high level after a first time period T1 has elapsed, so that clamping operation by the $V_{BB}$ clamping circuit 13 is released. When the clamping of the substrate voltage $V_{BB}$ is released, the semiconductor substrate 20 is gradually biased to a negative value by the $V_{BB}$ generating circuit 12. After turning on the power supply, since a signal $\overline{POR2}$ goes to a high level and an output of the inverter 21 goes down to a low level after a second time period T2 has elapsed, input prohibiting operation in the input prohibiting circuit 22 is released, so that an Int·RAS signal goes to a high level and then the main circuit 24 starts operating. When the main circuit 24 starts operating, the substrate voltage $V_{BB}$ rises, but does not reach a positive value because it is already biased to the negative value to some extent.

The time period T1 from the start of applying the supply voltage to the rising of the signal $\overline{POR1}$ and the time period T2 until the rising of the signal $\overline{POR2}$ vary with changes in a rising speed of the supply voltage. Therefore, if the supply voltage $V_{CC}$ rises sharply, the signals $\overline{POR1}$ and $\overline{POR2}$ happen to rise in the course of the rising of the supply voltage. In such a case, the clamping operation of the clamping circuit 13 is first released due to the rising of the signal $\overline{POR1}$; however, the signal $\overline{POR2}$ does not rise at this moment and the operation of the main circuit 24 is prohibited, so that the substrate voltage $V_{BB}$ scarcely rises. Subsequently, the signal $\overline{POR2}$ rises and the main circuit 24 starts operating; however, the substrate voltage $V_{BB}$ is almost 0 V, so that even if the main circuit 24 starts operating and the substrte voltage $V_{BB}$ rises, the driving capability of the $V_{BB}$ generating circuit 12 increases prior to latch up so that a rise in the substrate voltage $V_{BB}$ is suppressed, causing no latch up.

Figure 11:
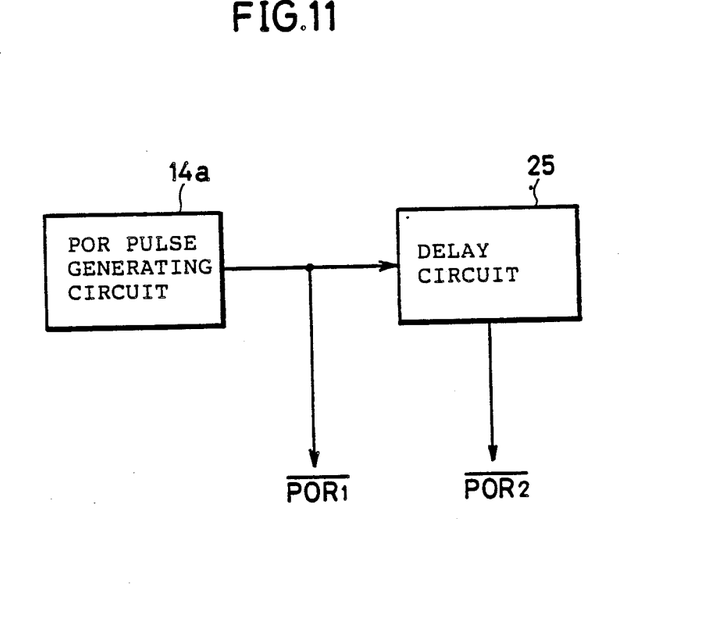
FIG. 11 is a block diagram illustrating a portion of the configuration of another embodiment of the present invention.

While two independent $\overline{POR}$ pulse generating circuits 14a and 14b are employed in the embodiment of FIG. 9, a single $\overline{POR}$ pulse generating circuit 14a may be employed to delay an output thereof in a delay circuit 25 and generate two kinds of pulses as shown in FIG. 11.

Furthermore, the NOR gate 23 is used as an input prohibiting circuit 22 in the embodiment of FIG. 9; however, a circuit having the same functions as those of the NOR gate may be employed not limited to the NOR gate.

As aforementioned, the present invention is widely applicable to semiconductor integrated circuit devices in general as well as to DRAM, static RAM, ROM etc. in the application of semiconductor storage devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device having a main circuit (24) on a semiconductor substrate thereof, said semiconductor integrated circuit device comprising, formed on the semiconductor substrate:

substrate bias applying means (12) for applying a constant reverse bias voltage;

an input circuit (17) for producing an internal signal defining the operation of said main circuit from an external signal;

first pulse signal generating means (14a) for generating a first pulse signal which is inverted when a first time period has elapsed since turning on of a power supply;

second pulse signal generating means (14b, 25) for generating a second pulse signal which is inverted when a second time period being longer than said first time period has elapsed since turning on of the power supply;

clamping means (13) responsive to said first pulse signal for fixing a potential of said semiconductor substrate to a ground potential during said first time period after turning on of the power supply; and prohibiting means (22) responsive to said second pulse signal for prohibiting the operation of said input circuit during said second time period after turning on of the power supply.

2. A semiconductor integrated circuit device according to claim 1, wherein said second pulse signal generating means comprises delay means (25) for delaying said first pulse signal in a given time period.

3. A semiconductor integrated circuit device according to claim 1, wherein said first pulse signal generating means and said second pulse signal generating means are of the same circuit configuration, each having a circuit constant selected to be a different value.

4. A semiconductor integrated circuit device according to claim 1, wherein said second time period is selected to be a time period in which said semiconductor substrate is sufficiently rendered reverse bias by said substrate bias applying means.

* * * * *